US006256362B1

(12) United States Patent
Goldman

(10) Patent No.: US 6,256,362 B1
(45) Date of Patent: Jul. 3, 2001

(54) FREQUENCY ACQUISITION CIRCUIT AND METHOD FOR A PHASE LOCKED LOOP

(75) Inventor: Stanley J. Goldman, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/107,307

(22) Filed: Jun. 30, 1998

(51) Int. Cl.[7] .................................................. H04L 7/00
(52) U.S. Cl. ................................. 375/373; 375/375
(58) Field of Search .................................... 375/371, 373, 375/374, 375, 376; 327/155–157

(56) References Cited

U.S. PATENT DOCUMENTS

| | | | |
|---|---|---|---|
| 4,808,884 | * | 2/1989 | Hull et al. ............................. 375/376 |
| 4,902,920 | * | 2/1990 | Wolaver ................................ 328/155 |
| 5,111,151 | * | 5/1992 | Ii ......................................... 328/155 |
| 5,790,613 | * | 8/1998 | Tateishi ................................ 375/376 |
| 5,910,753 | * | 6/1999 | Bogdan ................................ 375/376 |
| 6,078,634 | * | 6/2000 | Basshart .............................. 375/376 |

* cited by examiner

Primary Examiner—Tesfaldet Bocure
(74) Attorney, Agent, or Firm—Robert D. Marshall, Jr.; W. James Brady, III; Frederick J. Telecky, Jr.

(57) ABSTRACT

A circuit (14) for aiding proper frequency lock in a phase locked loop (12) includes a phase detector (40) adapted for receiving an input signal and an oscillator output signal from the phase locked loop (12) and generating an up and a down pulse width modulated signal indicative of a cycle slip between the input signal and the oscillator output signal. An up cycle slip detector (42a) receives the up pulse width modulated cycle slip signal and generates an up cycle slip signal indicative that the oscillator output signal is lagging behind the input signal. A down cycle slip detector (42b) receives the down pulse width modulated cycle slip signal and generates a down cycle slip signal indicative that the oscillator output signal is ahead of the input signal. A phase correction circuit (41, 43) is provided for generating a steering signal in response to the up and down cycle slip signals.

37 Claims, 6 Drawing Sheets

FREQUENCY ACQUISITION CIRCUIT AND METHOD FOR A PHASE LOCKED LOOP

TECHNICAL FIELD OF THE INVENTION

This invention is related in general to the field of frequency synthesis and clock recovery circuits. More particularly, the invention is related to a frequency acquisition circuit for a phase locked loop.

BACKGROUND OF THE INVENTION

Clock recovery circuits for telecommunications applications, and industrial and automotive control applications require digital and analog phase locked loop circuits to generate clock and timing signals from a reference frequency. For example, clock signals may be generated in this manner for microprocessors that control certain automobile functions, such as instrument panel displays, window controls, anti-lock brakes, engine functions, etc. Phase locked loop circuits used in these applications use a phase detector that is typically exclusive-OR (XOR) gate-based, which possess the desirable characteristic of good noise immunity. Because noise in the typical operating environment may corrupt the reference frequency, the phase locked loop may lock to the wrong frequency at twice or half of the reference frequency, for example, or lose lock entirely. Further, because there is no mechanism to detect the loss of lock or to regain lock onto the correct reference frequency, the resultant clock signal may cause the controlled apparatus or function to malfunction and fail.

One solution to this problem is to detect a loss of lock condition and then requiring the phase locked loop to go through a complete reset cycle. However, this solution causes the system to go off line. Further, it is difficult to implement a loss of lock detector in a high noise environment that does not generate erroneous results.

SUMMARY OF THE INVENTION

Accordingly, there is a need for a method and apparatus that aides in the locking of a phase locked loop to the correct frequency and that aides in recovering from loss of lock conditions.

In accordance with the present invention, a frequency acquisition circuit and method are provided which eliminate or substantially reduce the disadvantages associated with prior circuits and methods.

In one aspect of the invention, a circuit for aiding proper frequency lock in a phase locked loop includes a phase detector adapted for receiving an input signal and an oscillator output signal from the phase locked loop and generating an up and a down pulse width modulated signal indicative of a cycle slip between the input signal and the oscillator output signal. An up cycle slip circuit receives the up pulse width modulated cycle slip signal and generates an up cycle slip signal indicative that the oscillator output signal is lagging behind the input signal. A down cycle slip circuit is adapted for receiving the down pulse width modulated cycle slip signal and generating a down cycle slip signal indicative that the oscillator output signal is ahead of the input signal. A phase correction circuit is provided for generating a steering signal in response to the up and down cycle slip signals.

In another aspect of the invention, a method for aiding proper frequency lock in a phase locked loop includes the steps of detecting a phase difference between an input signal and an oscillator output signal from the phase locked loop and generating an up and a down pulse width modulated signal indicative of a cycle slip between the input signal and the oscillator output signal. An up cycle slip signal is then generated in response to the up pulse width modulated signal indicative that the oscillator output signal is lagging behind the input signal, and a down cycle slip signal is generated in response to the down pulse width modulated signal indicative that the oscillator output signal is ahead of the input signal. A steering signal is then produced in response to the up and down cycle slip signals which is then provided to the phase locked loop to increase or decrease the frequency of the oscillator output signal.

A technical advantage of the present invention is that a mechanism and method are provide to wrap around an existing phase locked loop to allow it to reacquire lock in case of a glitch, prevent false locking to the wrong frequency, and detect unlock conditions.

BRIEF DESCRIPTION OF THE DRAWINGS

For a better understanding of the present invention, reference may be made to the accompanying drawings, in which.

DETAILED DESCRIPTION OF THE INVENTION

Figure 1:
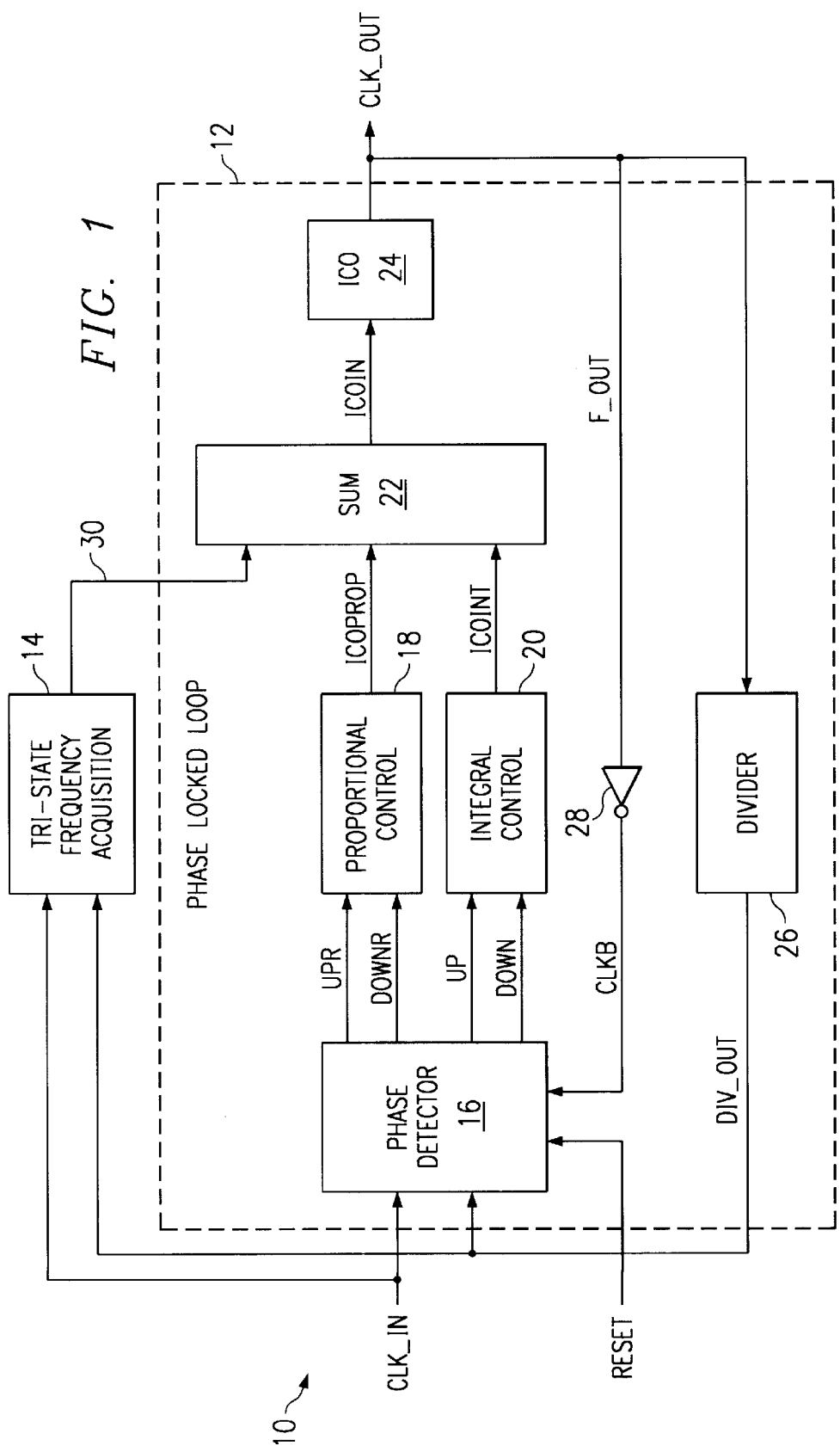
FIG. 1 is a simplified block diagram of a typical phase locked loop with a tri-state frequency acquisition circuit constructed according to the teachings of the present invention.

The preferred embodiment(s) of the present invention is (are) illustrated in FIGS. 1–5, like reference numerals being used to refer to like and corresponding parts of the various drawings.

Referring to FIG. 1, a frequency acquisition aided phase locked loop 10 is shown. Frequency acquisition aided phase locked loop 10 includes a conventional phase locked loop 12 coupled to a tri-state frequency acquisition circuit 14. Phase locked loop 12 includes a phase detector 16 which receives an input signal, CLK_IN, which serves as a reference frequency. CLK_IN may be generated by a crystal oscillator (not shown), for example. Phase detector 16 is preferably an exclusive-OR (XOR) gate based phase detector which has good noise immunity suitable to telecommunications, industrial, and automotive applications. Phase detector 16 is coupled to a proportional control circuit 18 and an integral control circuit 20. Phase detector 16 generates two sets of signals: UPR and DOWNR, which are provided to a proportional control circuit or filter 18; and UP and DOWN, which are provided to an integral control circuit or filter 20. Proportional control circuit 18 and integral control circuit 20 are further coupled to a summation circuit 22, which also receives a steering signal from tri-state frequency acquisition circuit 14. The output of the summation circuit is provided to a current controlled oscillator (ICO) 24, which generates an output signal, CLK_OUT. The CLK_OUT signal is provided to a divider circuit 26, which divides the CLK_OUT signal by a predetermined numeral, such as 512. The DIV_OUT divided signal or the oscillator output signal therefrom is then fed back to phase detector 16. The CLK_OUT signal is also inverted by an inverter 28 and provided to phase detector 16 and used as a sampling clock signal to generate UP and DOWN signals. A reset signal may also be provided to phase detector 16, which causes phase locked loop to reset upon power up or on a software reset.

In operation, tri-state frequency acquisition circuit 14 uses a frequency discrimination method to steer the signal into the locking range of phase locked loop 12. This allows reacquisition of lock after the first lock attempt and recovery from glitches after lock. Tri-state frequency acquisition circuit 14 detects cycle slips between CLK_IN and DIV_OUT signals, and then generates a steering signal 30 which is provided to summation circuit 22. A cycle slip is defined as the CLK_IN and DIV_OUT being out of phase 360°, i.e. being in phase, out of phase, then in phase again. Phase detector 16 compares the waveform edges of the CLK_IN and DIV_OUT signals, detects an edge difference, and generates phase error signals, UPR, DOWNR, UP, and DOWN. The phase error signals are then processed by proportional control circuit 18 and integral control circuit 20 to generate phase correction currents that are summed with steering signal 30. Integral control circuit 20 provides a coarse (or digital) correction signal, ICOINT, converted to a current by a digital to analog converter (DAC) 21. Proportional control circuit 18 provides a fine tune (or analog) correction current, ICOPROP. The summed current is used to control current controlled oscillator 24 so that the edges of DIV_OUT tracks the edges of CLK_IN.

Figure 2:
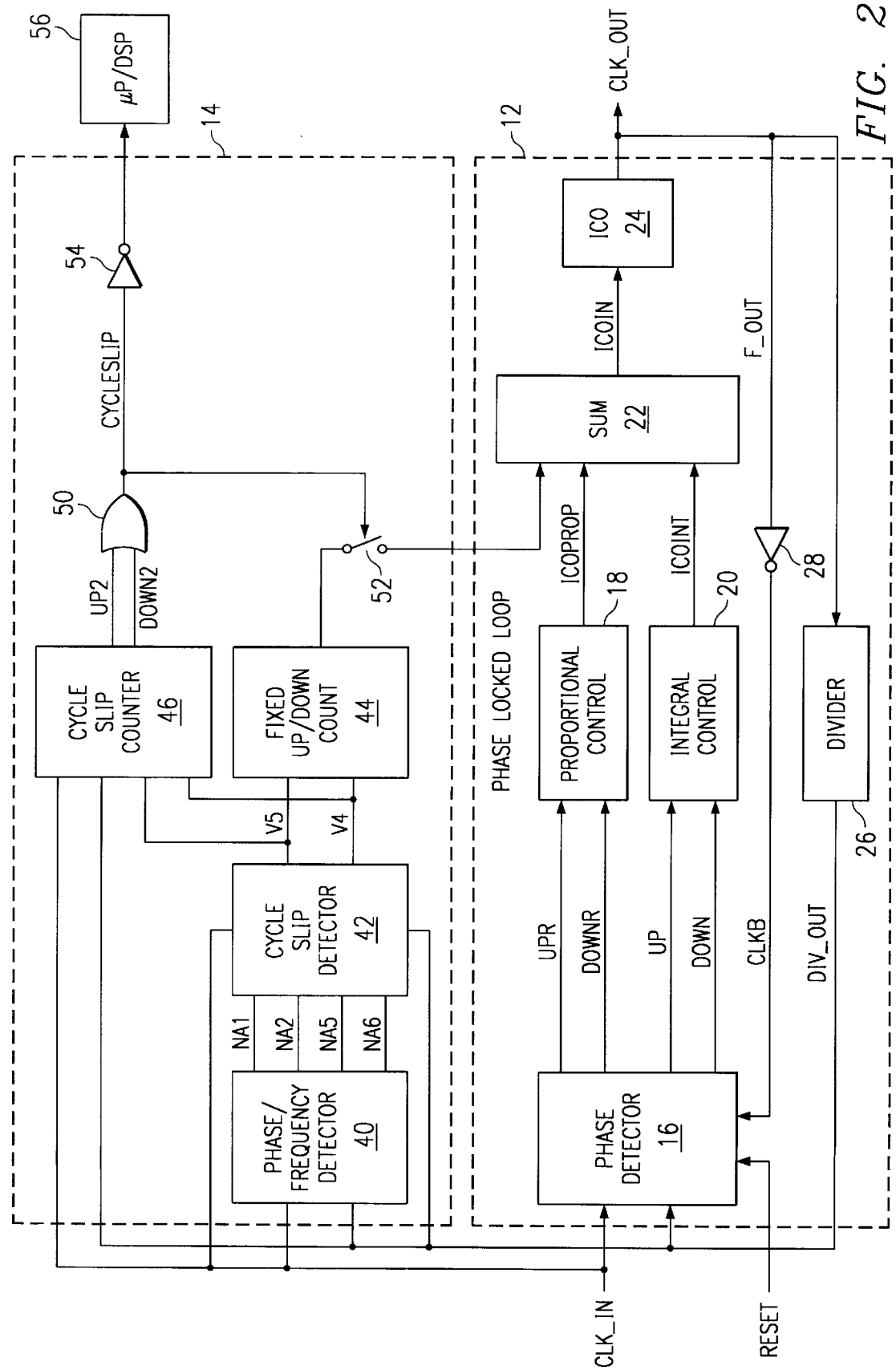
FIG. 2 is a more detailed block diagram of the tristate frequency acquisition circuit constructed according to the teachings of the present invention.

FIG. 2 is a more detailed block diagram of tri-state frequency acquisition circuit coupled to phase locked loop 12. Tri-state frequency acquisition circuit 14 includes a phase/frequency detector 40 receiving both CLK_IN and DIV_OUT signals. Phase/frequency detector 40 is coupled to a cycle slip detector 42, which is further coupled to a fixed up/down counter 44 and a cycle slip counter 46. Fixed up/down counter 44 generates a step signal, converted by a digital to analog converter (DAC) inside 44 into a steering current, which is then provided to summation circuit 22. The output of cycle slip counter 46 is provided to a NOR gate 50, the output (CYCLESLIP) of which is used to control a switch 52 allowing the output of fixed up/down counter 44 to pass to summation circuit 22 of phase locked loop 12. CYCLESLIP signal from NOR gate 50 may be inverted by an inverter 54 and further provided to a microprocessor or digital signal processor 56 for software monitoring and alarm purposes. Alternatively, the inverted CYCLESLIP signal from inverter 54 may be used to selectively connect the ICOINT output of integral control circuit 20 and the ICOPROP of proportional control circuit 18 to summation circuit 22. The operations of tri-state frequency acquisition circuit 14 is described in more detail below.

Figure 3:
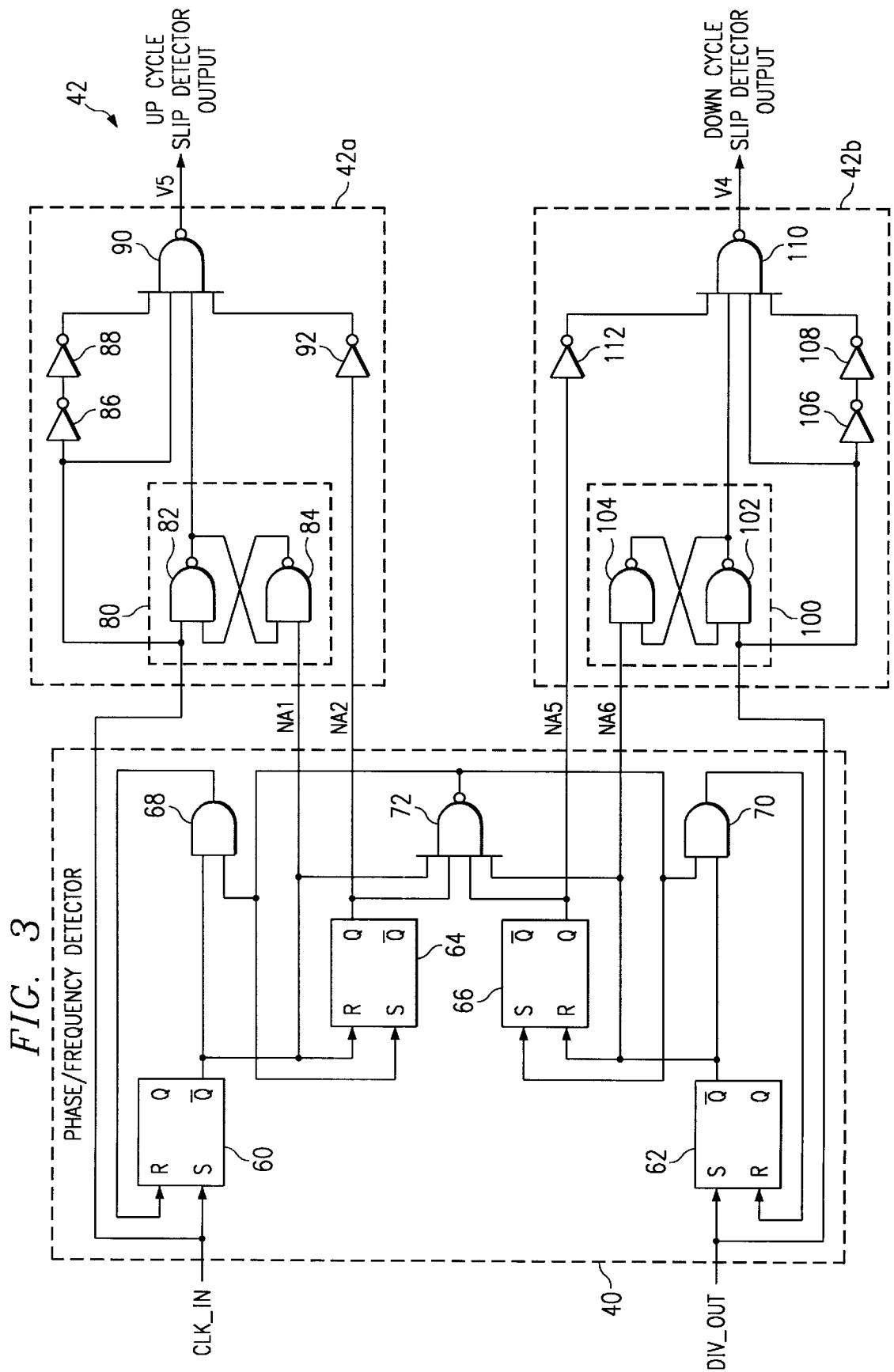
FIG. 3 is an even more detailed block diagram of the tri-state frequency acquisition circuit constructed according to the teachings of the present invention.

FIG. 3 is a more detailed block diagram of phase/frequency detector 40 and cycle slip detector 42 constructed according to the teachings of the present invention. Phase/frequency detector 40 includes a first RS latch 60, where the set input receives the CLK_IN signal, and a second RS latch 62, where the set input receives the DIV_OUT signal. The respective inverted outputs, NA1 and NA5, of first and second RS latches 60 and 62 are provided to the reset inputs of third and fourth RS latches 64 and 66, respectively. The respective inverted outputs of first and second RS latches 60 and 62 are further provided to AND gates 68 and 70, the output from which are fed back to the reset input of first and second RS latches 60 and 62, respectively. The outputs from third and fourth RS latches 64 and 66, NA2 and NA6 respectively, are provided to a NAND gate 72, which also receives the inverted output from first and second RS latches 60 and 64. The output from NAND gate 72 is coupled to the set inputs of third and fourth RS latches 64 and 66 and the reset inputs of the first and second latches.

Cycle slip detector 42 has two sets of latch and combinatorial logic circuits 42a and 42b which provide an up cycle slip signal (V5) and a down cycle slip signal (V4), respectively. First latch and combinatorial logic circuit 42a includes a latch 80, which includes two interconnected NAND gates 82 and 84. NAND gate 82 receives as input the CLK_IN signal and the output of NAND gate 84, and NAND gate 84 receives as input the inverted output from first RS latch 60 (NA1) and the output of NAND gate 82. The output from NAND gate 82 is coupled to a four-input NAND gate 90, which also receives as input, the CLK_IN reference signal, and the CLK_IN signal inverted twice by inverters 86 and 88. A fourth input to NAND gate 90 receives the inverted output of third RS latch 64 (NA2), which is inverted by an inverter 92.

The second set of latch and combinatorial logic circuit 42b of cycle slip detector 42 is similarly constructed as the first set. Latch and combinatorial logic circuit 42b includes a latch 100, which includes two interconnected NAND gates 102 and 104. NAND gate 102 receives as input the DIV_OUT signal and the output of NAND gate 104, and NAND gate 104 receives as input the inverted output from second RS latch 62 (NA6) and the output of NAND gate 102. The output from NAND gate 102 is coupled to a four-input NAND gate 110, which also receives as input, the DIV_OUT signal, and the DIV_OUT signal inverted twice by inverters 106 and 108. A fourth input to NAND gate 110 receives the inverted output of fourth RS latch 66 (NA5), which is inverted by an inverter 112.

Figure 4:
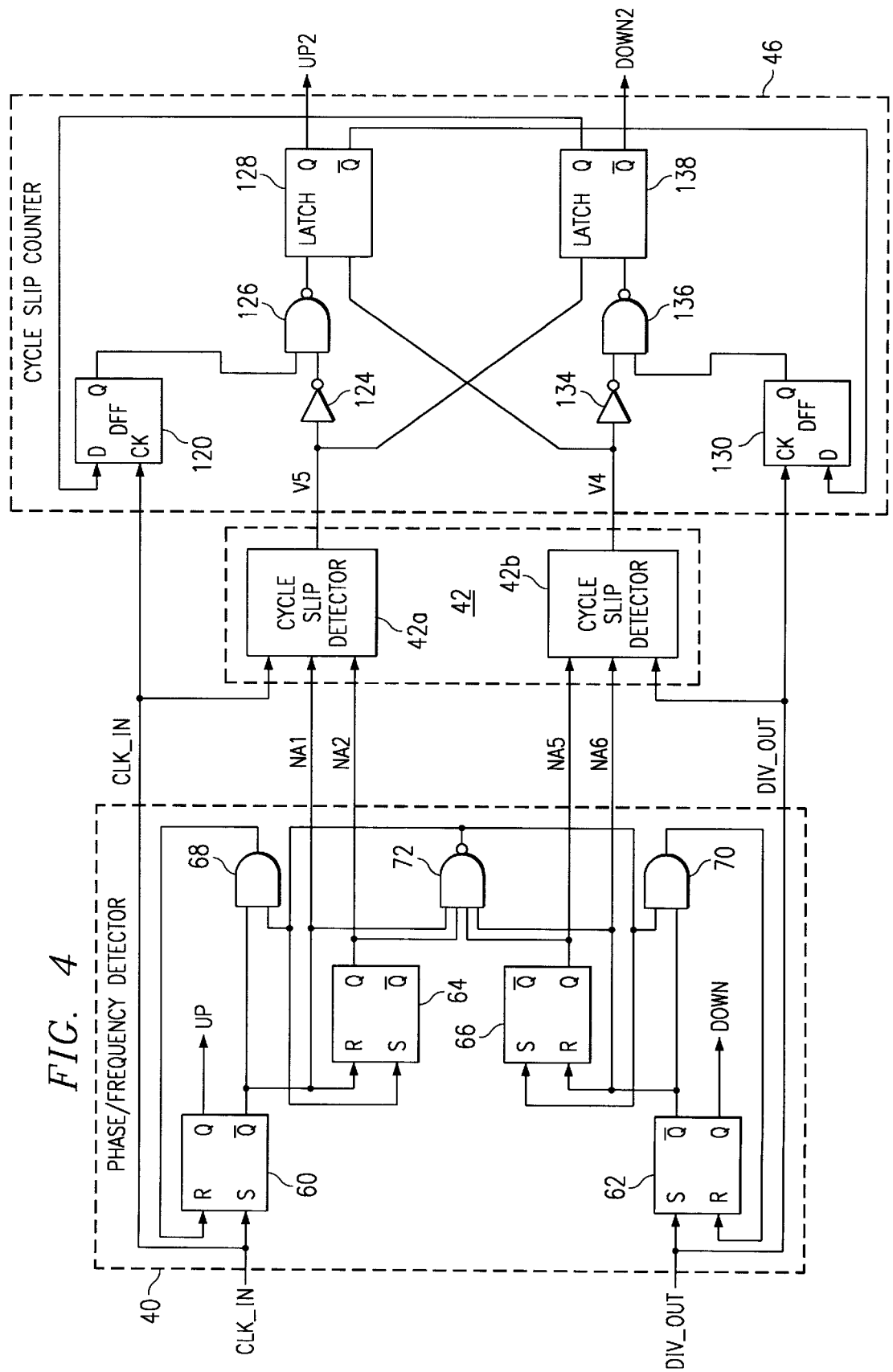
FIG. 4 is a more detailed block diagram of a cycle slip detector circuit constructed according to the teachings of the present invention.

FIG. 4 is a more detailed block diagram of cycle slip counter 46 shown coupled to cycle slip detector 42 and phase/frequency detector 40. Cycle slip counter includes a D flip-flop 120 coupled to receive the CLK_IN reference signal as a clock input, and having an output coupled to an input of a NAND gate 126. NAND gate 126 is further coupled to the output of an inverter 124, which is coupled to the output (VS) of cycle slip detector latch and combinatorial logic circuit 42a. The output of NAND gate 126 is coupled to a latch, which is also coupled to the output of the second cycle slip latch and combinatorial logic circuit 42b. The output of latch 128 provides an UP2 signal, and the inverted output of latch 128 is provided as an input to a D flip-flop 130. The clock input of D flip-flop 130 receives the DIV_OUT signal. The output of D flip-flop 130 is coupled to an input of a NAND gate 136, which also receives an inverted output V4 of cycle slip latch and combinatorial logic circuit 42b from an inverter 134. The output of NAND gate 136 is coupled to latch 138. The output of latch 138 is coupled to the input of D flip-flop 120.

In operation, phase/frequency detector 40 generates a first pulse width modulated signal output, NA1, when DIV_OUT has a frequency less than that of CLK_IN, and further generates a second pulse width modulated signal output, NA6, when DIV_OUT has a frequency greater than that of CLK_IN. The pulse width modulated signals indicate the phase difference between CLK_IN and DIV_OUT. The pulse width modulated signals, NA1, NA6, and intermediate signals NA2 and NA5 are provided to cycle slip detector 42. Sampling the pulse width modulated signals, NA1 and NA6, with CLK_IN and DIV OUT, respectively, latches 80 and 100 latch the states thereof, including a detection of cycle slip. A cycle slip is indicated by no response or no edge in the pulse width modulated signals. When all inputs to NAND gates 90 or 110 are all high, then the corresponding output signal, UP cycle slip detector output or DOWN cycle slip detector output becomes low.

Figure 5:
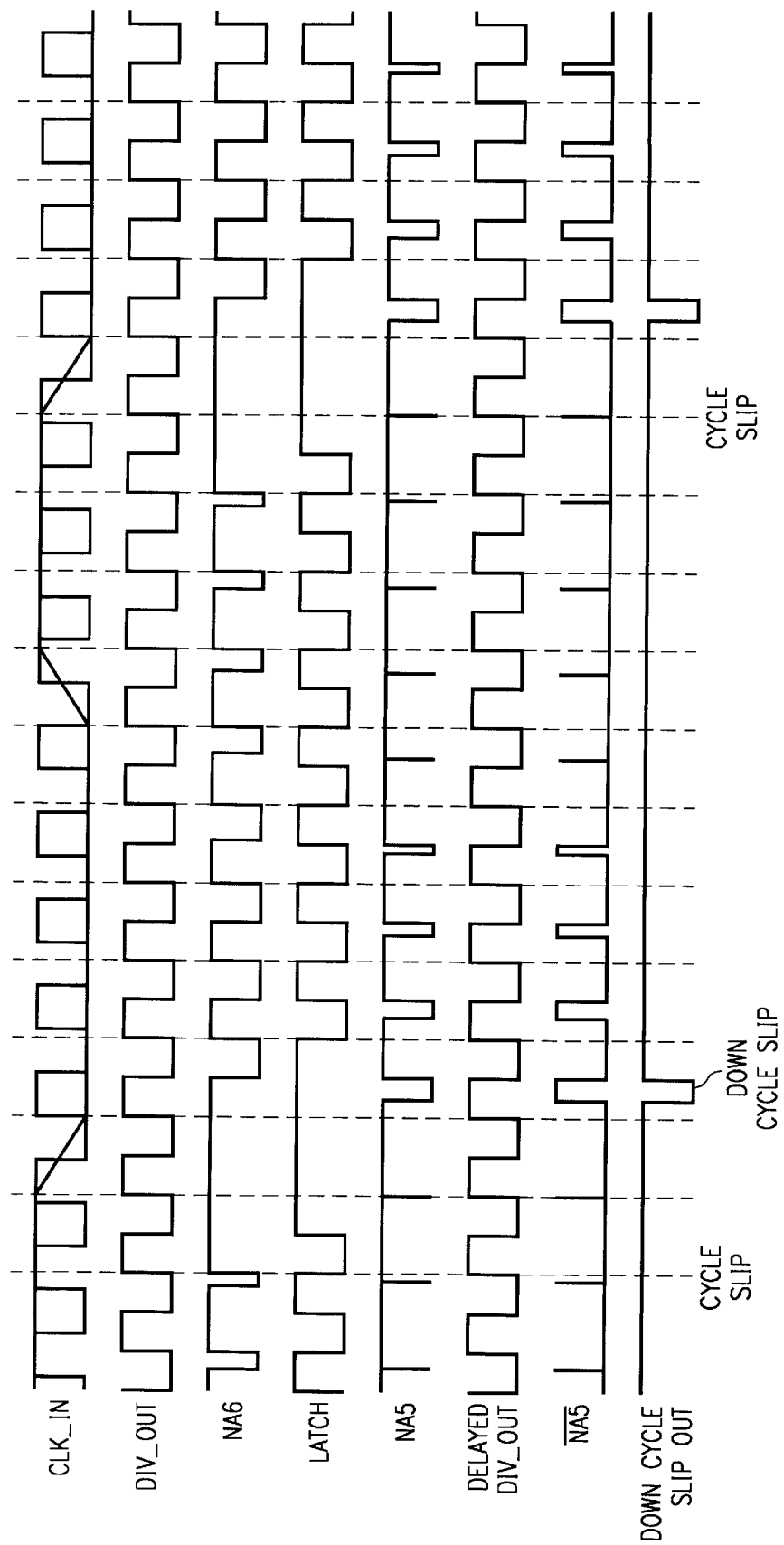
FIG. 5 is a timing diagram showing the operations of the frequency acquisition circuit aided phase locked loop according to the teachings of the present invention.

Referring to FIG. 5 for a timing diagram of logic waveforms at various points in tri-state frequency acquisition circuit 14. In this example, the frequency of DIV_OUT is greater than that of CLK_IN, which are 50 MHz and 45 MHz, respectively. It may be seen that a 5 MHz beat note, indicated by the waveform superimposed on CLK_IN, is generated by the difference between CLK_IN and DIV_OUT. Using the rising edge to rising edge of DIV_OUT as a cycle bin and reflecting these bins on the logic levels at NA6, a cycle with no edge occurs on the NA6 waveform in two spots, as indicated. These are cycle slips. A cycle slip occurs when an edge in question (in this example the rising edge) of CLK_IN and DIV_OUT slip past each other. Recall that NA6 is an output of phase/frequency detector latches 62 that detect the phase difference between CLK_IN and DIV_OUT as a pulse width modulated waveform. Sampling the non-response (no edge) latches the cycle slip by latch 100 as shown by waveform LATCH (FIG. 3). The combinatorial logic (inverters 106, 108, and 112, and NAND gate 110) in cycle slip detector 42b then generates the down cycle slip output shown in FIG. 5. The low level pulse in the down cycle slip signal (V4) indicates a down cycle slip. In the same manner, an up cycle slip signal (VS) is also generated by cycle slip detector 42a.

Referring back to FIG. 4, logic levels at V4 and V5 are provided to cycle slip counter 46. A down cycle slip resets latch 138 in cycle slip counter 46 to a $\bar{Q}$ high value if the output of D flip-flop 130 is high. A previous down cycle slip had to clear out an up cycle slip in order to set D flip-flop output 130 high. On the negative edge of CLK_IN, D flip-flop 120 is set low to gate out any changes to the UP2 output. At the next up cycle slip, latch 138 is set so that its Q output is high, which clears out the stored low value in D flip-flop 120 and enables latch 128, so that the next up cycle slip causes the UP2 output to go high. This switching action shows that in order for one of the UP2 or DOWN2 outputs to transition to a high state, one of the output signals has to go through an output of UP2 low and DOWN 2 low state.

The UP2 and DOWN2 signals are OR'ed by OR gate 50 to generate a CYCLESLIP signal, which is used to connect the output of fixed up/down counter 44 to summation circuit 22. Fixed up/down counter 44 receives V4 and V5 signals and determines the number of DAC steps the oscillator output signal (DIV_OUT) is either ahead or behind the input reference (CLK_IN) signal. The number of DAC steps depends on the step size, which may be set at 500 ηA. Depending on the states of V5 and V4 signals provided to fixed up/down counter 44, its output signal, after conversion to a current by DAC 45, increases or decreases the control current input to current controlled oscillator 24. Preferably, the steering current from DAC 45 is sufficient to override the control currents from integral control 20 and proportional control 18, and yet is not so large as to steer CLK_OUT out of range of phase locked loop 12. In this implementation, the number of DAC steps to increase or decrease the control current has been determined to be two. However, cycle slip counter 46 may be configured to generate the cycle slip output signals at any number of cycle slips to further desensitize phase locked loop to false clock edges. Further, the up and down step sizes may also be adjusted to vary the acquisition time of tri-state frequency acquisition circuit 14.

Figure 6:
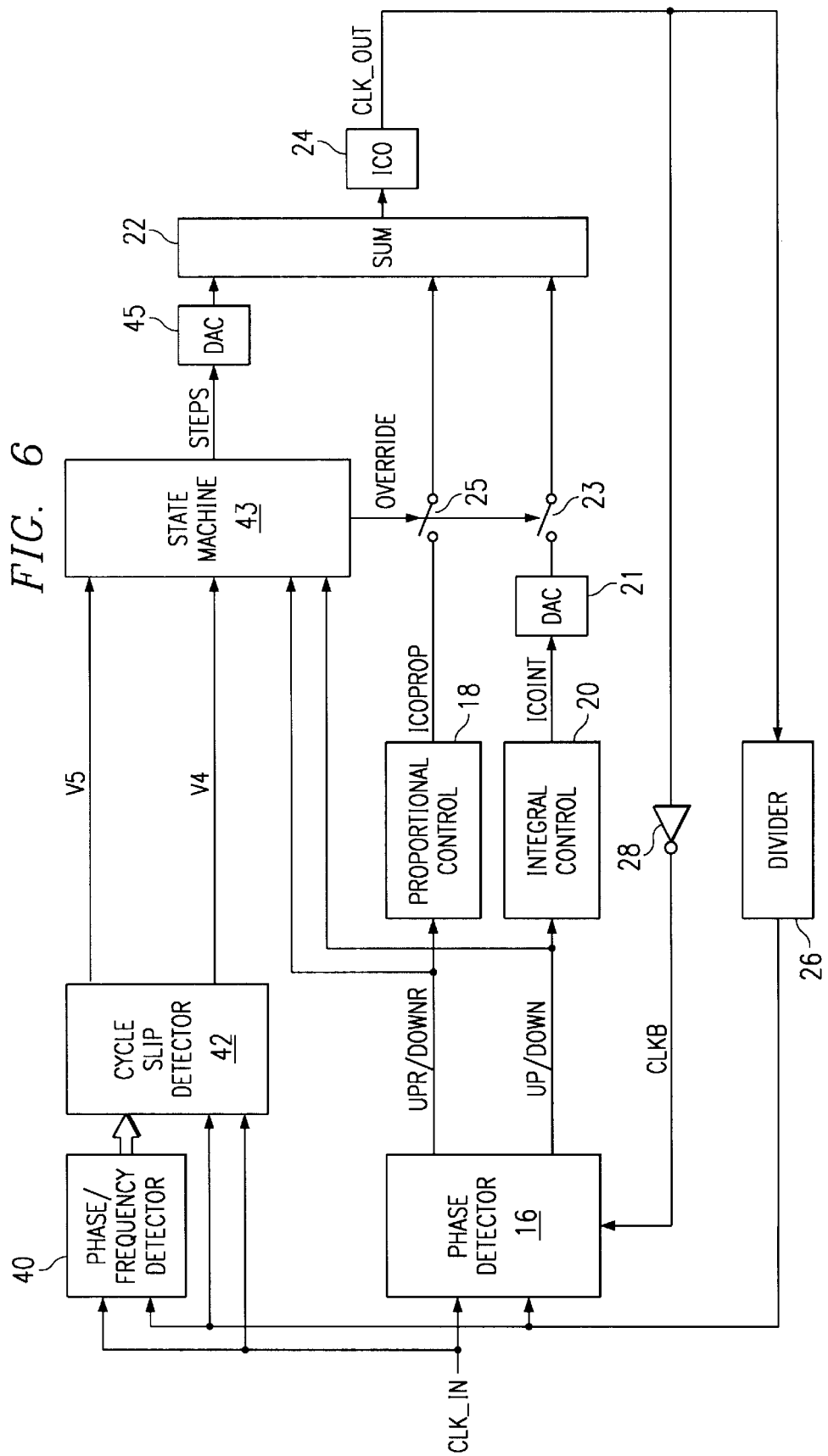
FIG. 6 is more detailed block diagram of an alternative embodiment of the tri-state frequency acquisition circuit according to the teachings of the present invention.

Referring to FIG. 6, an alternative embodiment of the teachings of the present invention is shown. Tri-state frequency acquisition circuit 14 includes a phase/frequency detector 40 coupled to a cycle slip detector 42, both constructed and operating as described above. A state machine 43 is coupled to cycle slip detector 42 as well as phase detector 16 for receiving signals V4, V5, UP, DOWN, UPR, and DOWNR. State machine 43 performs the functions of cycle slip counter 46, fixed up/down counter 44, OR gate 50, and inverter 54 to effectively produce a steering signal indicative of the number of DAC steps to steer the ICO output. DAC 45 converts the steering signal into a steering current, which is provided to summation circuit 22. State machine 43 may also generate an override signal that disconnects the outputs from integral control and proportional control circuits 20 and 18 from summation circuit 22 when phase correction is necessary.

Constructed in this manner, tri-state frequency acquisition circuit 14 provides a mechanism for a phase locked loop to reacquire lock in case of a glitch, prevent false locking to the wrong frequency, and detect unlock conditions.

Although several embodiments of the present invention and its advantages have been described in detail, it should be understood that mutations, changes, substitutions, transformations, modifications, variations, and alterations can be made therein without departing from the teachings of the present invention, the spirit and scope of the invention being set forth by the appended claims.

What is claimed is:

1. A circuit for aiding proper frequency lock in a phase locked loop, comprising:

a phase detector adapted for receiving an input signal and an oscillator output signal from the phase locked loop and generating an up and a down pulse width modulated signal indicative of a cycle slip between the input signal and the oscillator output signal;

an up cycle slip detector latching the up pulse width modulated cycle slip signal with the input signal and generating an up cycle slip signal indicative that the oscillator output signal is lagging behind the input signal;

a down cycle slip detector latching the down pulse width modulated cycle slip signal with the oscillator output signal and generating a down cycle slip signal indicative that the oscillator output signal is ahead of the input signal; and a phase correction circuit generating a steering signal in response to the up and down cycle slip signals, the phase correction circuit including a cycle slip circuit receiving the up and down cycle slip signals and including a cycle slip counter for generating an UP2 signal in response to receiving two consecutive up cycle slip signals or generating a DOWN2 signal in response to receiving two consecutive down cycle slip signals, and an OR gate receiving the UP2 and DOWN2 signals and generating a cycle slip signal for selectively connecting or disconnecting a steering signal to the phase locked loop; and a fixed up/down counter receiving the up and down cycle slip signals and being adapted for generating the steering signal indicative of the amount of correction desired.

2. The circuit, as set forth in claim 1, wherein the phase correction circuit further comprises a digital to analog converter coupled to the fixed up/down counter being adapted for converting the steering signal into a steering current.

3. The circuit, as set forth in claim 1, wherein the cycle slip circuit comprises a cycle slip counter for counting a predetermined number of consecutive up cycle slip signals or a predetermined number of consecutive down cycle slip signals being received.

4. The circuit, as set forth in claim 1, wherein the phase correction circuit comprises a state machine.

5. The circuit, as set forth in claim 1, wherein the up cycle slip detector comprises:
    a latch adapted for latching the up pulse width modulated cycle slip signal with the input signal; and
    a logic circuit adapted for receiving the latched up pulse width modulated cycle slip signal and generating an up cycle slip signal indicative that the oscillator output signal is lagging behind the input signal.

6. The circuit, as set forth in claim 1, wherein the down cycle slip detector comprises:
    a latch adapted for latching the down pulse width modulated cycle slip signal with the oscillator output signal; and
    a logic circuit adapted for receiving the latched down pulse width modulated cycle slip signal and generating a down cycle slip signal indicative that the oscillator output signal is ahead of the input signal.

7. A circuit for aiding proper frequency lock in a phase locked loop, comprising:
    a phase detector adapted for receiving an input signal and an oscillator output signal from the phase locked loop and generating an up and a down pulse width modulated signal indicative of a cycle slip between the input signal and the oscillator output signal;
    an up cycle slip detector latching the up pulse width modulated cycle slip signal with the input signal and generating an up cycle slip signal indicative that the oscillator output signal is lagging behind the input signal;
    a down cycle slip detector latching the down pulse width modulated cycle slip signal with the oscillator output signal and generating a down cycle slip signal indicative that the oscillator output signal is ahead of the input signal; and
    a phase correction circuit generating a steering signal in response to the up and down cycle slip signals, wherein the phase correction circuit comprises:
    a first D flip-flop coupled to the first logic circuit and receiving the up cycle slip signal clocked by the input signal;
    a first NAND gate coupled to the output of the first D flip-flop and also receiving an inverted up cycle slip signal;
    a first latch receiving an output of the first NAND gate and the down cycle slip signal and generating an UP2 signal;
    a second D flip-flop coupled to the second logic circuit and receiving the down cycle slip signal clocked by the oscillator output signal;
    a second NAND gate coupled to the output of the second D flip-flop and also receiving an inverted down cycle slip signal; and
    a second latch receiving an output of the second NAND gate and the up cycle slip signal and generating a DOWN2 signal.

8. The circuit, as set forth in claim 7, wherein the phase correction circuit comprises:
    a cycle slip circuit receiving the up and down cycle slip signals and being adapted for generating a cycle slip signal in response to a predetermined number of consecutive up or down cycle slip signals being received; and
    a fixed up/down counter receiving the up and down cycle slip signals and being adapted for generating a steering signal indicative of the amount of correction desired.

9. The circuit, as set forth in claim 8, wherein the phase correction circuit further comprises a digital to analog converter coupled to the fixed up/down counter being adapted for converting the steering signal into a steering current.

10. The circuit, as set forth in claim 8, wherein the cycle slip circuit comprises a cycle slip counter for counting a predetermined number of consecutive up cycle slip signals or a predetermined number of consecutive down cycle slip signals being received.

11. The circuit, as set forth in claim 7, wherein the phase correction circuit comprises a state machine.

12. The circuit, as set forth in claim 7, wherein the up cycle slip detector comprises:
    a latch adapted for latching the up pulse width modulated cycle slip signal with the input signal; and
    a logic circuit adapted for receiving the latched up pulse width modulated cycle slip signal and generating an up cycle slip signal indicative that the oscillator output signal is lagging behind the input signal.

13. The circuit, as set forth in claim 7, wherein the down cycle slip detector comprises:
    a latch adapted for latching the down pulse width modulated cycle slip signal with the oscillator output signal; and
    a logic circuit adapted for receiving the latched down pulse width modulated cycle slip signal and generating a down cycle slip signal indicative that the oscillator output signal is ahead of the input signal.

14. A circuit for aiding proper frequency lock in a phase locked loop, comprising:
    a phase detector adapted for receiving an input signal and an oscillator output signal from the phase locked loop and generating an up and a down pulse width modulated signal indicative of a cycle slip between the input signal and the oscillator output signal, wherein the phase detector comprises:
    a first RS latch receiving the input signal at its set input;
    a second RS latch receiving the inverted output of the first RS latch at its reset input;
    a third RS latch receiving the oscillator output signal at its set input;
    a fourth RS latch receiving the inverted output of the first RS latch at its reset input;
    a NAND gate coupled to the non-inverted outputs of the second and fourth RS latches, and the inverted outputs of the first and third RS latches, and generating an output;
    the output from the NAND gate further being coupled to the set inputs of the second and fourth RS latches;
    a first AND gate being coupled to the inverted output of the first RS latch and the output of the NAND gate, the output of the first AND gate being coupled to the reset input of the first RS latch;

a second AND gate being coupled to the inverted output of the third RS latch and the output of the NAND gate, the output of the second AND gate being coupled to the reset input of the third RS latch; and the up pulse width modulated cycle slip signal being the inverted output of the first RS latch, and the down pulse width modulated cycle slip signal being the inverted output of the third RS latch;

an up cycle slip detector latching the up pulse width modulated cycle slip signal with the input signal and generating an up cycle slip signal indicative that the oscillator output signal is lagging behind the input signal;

a down cycle slip detector latching the down pulse width modulated cycle slip signal with the oscillator output signal and generating a down cycle slip signal indicative that the oscillator output signal is ahead of the input signal; and a phase correction circuit generating a steering signal in response to the up and down cycle slip signals.

15. The circuit, as set forth in claim 14, wherein the phase correction circuit comprises:

a cycle slip circuit receiving the up and down cycle slip signals and being adapted for generating a cycle slip signal in response to a predetermined number of consecutive up or down cycle slip signals being received; and a fixed up/down counter receiving the up and down cycle slip signals and being adapted for generating a steering signal indicative of the amount of correction desired.

16. The circuit, as set forth in claim 15, wherein the phase correction circuit further comprises a digital to analog converter coupled to the fixed up/down counter being adapted for converting the steering signal into a steering current.

17. The circuit, as set forth in claim 15, wherein the cycle slip circuit comprises a cycle slip counter for counting a predetermined number of consecutive up cycle slip signals or a predetermined number of consecutive down cycle slip signals being received.

18. The circuit, as set forth in claim 14, wherein the phase correction circuit comprises a state machine.

19. The circuit, as set forth in claim 14, wherein the up cycle slip detector comprises:

a latch adapted for latching the up pulse width modulated cycle slip signal with the input signal; and a logic circuit adapted for receiving the latched up pulse width modulated cycle slip signal and generating an up cycle slip signal indicative that the oscillator output signal is lagging behind the input signal.

20. The circuit, as set forth in claim 14, wherein the down cycle slip detector comprises:

a latch adapted for latching the down pulse width modulated cycle slip signal with the oscillator output signal; and a logic circuit adapted for receiving the latched down pulse width modulated cycle slip signal and generating a down cycle slip signal indicative that the oscillator output signal is ahead of the input signal.

21. A circuit for aiding proper frequency lock in a phase locked loop, comprising:

a phase detector adapted for receiving an input signal and an oscillator output signal from the phase locked loop and generating an up and a down pulse width modulated signal indicative of a cycle slip between the input signal and the oscillator output signal;

a first latch adapted for latching the up pulse width modulated cycle slip signal with the input signal;

a first logic circuit adapted for receiving the latched up pulse width modulated cycle slip signal and generating an up cycle slip signal indicative that the oscillator output signal is lagging behind the input signal;

a second latch adapted for latching the down pulse width modulated cycle slip signal with the oscillator output signal;

a second logic circuit adapted for receiving the latched down pulse width modulated cycle slip signal and generating a down cycle slip signal indicative that the oscillator output signal is ahead of the input signal; and a phase correction circuit generating a steering signal in response to the up and down cycle slip signals, wherein the phase correction circuit comprises:

a first D flip-flop coupled to the first logic circuit and receiving the up cycle slip signal clocked by the input signal;

a first NAND gate coupled to the output of the first D flip-flop and also receiving an inverted up cycle slip signal;

a first latch receiving an output of the first NAND gate and the down cycle slip signal and generating an UP2 signal;

a second D flip-flop coupled to the second logic circuit and receiving the down cycle slip signal clocked by the oscillator output signal;

a second NAND gate coupled to the output of the second D flip-flop and also receiving an inverted down cycle slip signal; and a second latch receiving an output of the second NAND gate and the up cycle slip signal and generating a DOWN2 signal.

22. The circuit, as set forth in claim 21, wherein the phase correction circuit comprises:

a cycle slip circuit receiving the up and down cycle slip signals and being adapted for generating a cycle slip signal in response to a predetermined number of consecutive up or down cycle slip signals being received; and a fixed up/down counter receiving the up and down cycle slip signals and being adapted for generating a steering signal indicative of the amount of correction desired.

23. The circuit, as set forth in claim 22, wherein the cycle slip circuit comprises a cycle slip counter for counting a predetermined number of consecutive up cycle slip signals or a predetermined number of consecutive down cycle slip signals being received.

24. The circuit, as set forth in claim 22, wherein the phase correction circuit further comprises a digital to analog converter coupled to the fixed up/down counter being adapted for converting the steering signal into a steering current.

25. The circuit, as set forth in claim 21, wherein the phase correction circuit comprises a state machine.

26. The circuit, as set forth in claim 21, wherein the up cycle slip detector comprises:

a latch adapted for latching the up pulse width modulated cycle slip signal with the input signal; and a logic circuit adapted for receiving the latched up pulse width modulated cycle slip signal and generating an up cycle slip signal indicative that the oscillator output signal is lagging behind the input signal.

27. The circuit, as set forth in claim 21, wherein the down cycle slip detector comprises:
  a latch adapted for latching the down pulse width modulated cycle slip signal with the oscillator output signal; and
  a logic circuit adapted for receiving the latched down pulse width modulated cycle slip signal and generating a down cycle slip signal indicative that the oscillator output signal is ahead of the input signal.

28. A method for aiding proper frequency lock in a phase locked loop, comprising the steps of:
  detecting a phase difference between an input signal and an oscillator output signal from the phase locked loop and generating an up and a down pulse width modulated signal indicative of a cycle slip between the input signal and the oscillator output signal;
  generating an up cycle slip signal in response to the up pulse width modulated signal indicative that the oscillator output signal is lagging behind the input signal;
  generating a down cycle slip signal in response to the down pulse width modulated signal indicative that the oscillator output signal is ahead of the input signal;
  generating a cycle slip signal in response to receiving two consecutive up cycle slip signals or two consecutive down cycle slip signals;
  generating a steering signal in response to the up and down cycle slip signals and providing the steering signal to the phase locked loop to increase or decrease the frequency of the oscillator output signal;
  enabling the steering signal in response to the cycle slip signal.

29. The method, as set forth in claim 28, further comprising the step of converting the steering signal to a steering current.

30. The method, as set forth in claim 28, further comprising the step of overriding the phase locked loop control signals with the steering signal.

31. A circuit for aiding proper frequency lock in a phase locked loop, comprising:
  a phase detector adapted for receiving an input signal and an oscillator output signal from the phase locked loop and generating an up and a down pulse width modulated signal indicative of a cycle slip between the input signal and the oscillator output signal, wherein the phase detector comprises:
    a first RS latch receiving the input signal at its set input;
    a second RS latch receiving the inverted output of the first RS latch at its reset input;
    a third RS latch receiving the oscillator output signal at its set input;
    a fourth RS latch receiving the inverted output of the first RS latch at its reset input;
    a NAND gate coupled to the non-inverted outputs of the second and fourth RS latches, and the inverted outputs of the first and third RS latches, and generating an output;
    the output from the NAND gate further being coupled to the set inputs of the second and fourth RS latches;
    a first AND gate being coupled to the inverted output of the first RS latch and the output of the NAND gate, the output of the first AND gate being coupled to the reset input of the first RS latch;
    a second AND gate being coupled to the inverted output of the third RS latch and the output of the NAND gate, the output of the second AND gate being coupled to the reset input of the third RS latch; and
    the up pulse width modulated cycle slip signal being the inverted output of the first RS latch, and the down pulse width modulated cycle slip signal being the inverted output of the third RS latch;
  a first latch adapted for latching the up pulse width modulated cycle slip signal with the input signal;
  a first logic circuit adapted for receiving the latched up pulse width modulated cycle slip signal and generating an up cycle slip signal indicative that the oscillator output signal is lagging behind the input signal;
  a second latch adapted for latching the down pulse width modulated cycle slip signal with the oscillator output signal;
  a second logic circuit adapted for receiving the latched down pulse width modulated cycle slip signal and generating a down cycle slip signal- indicative that the oscillator output signal is ahead of the input signal; and
  a phase correction circuit generating a steering signal in response to the up and down cycle slip signals.

32. The circuit, as set forth in claim 31, wherein the phase correction circuit comprises:
  a cycle slip circuit receiving the up and down cycle slip signals and being adapted for generating a cycle slip signal in response to a predetermined number of consecutive up or down cycle slip signals being received; and
  a fixed up/down counter receiving the up and down cycle slip signals and being adapted for generating a steering signal indicative of the amount of correction desired.

33. The circuit, as set forth in claim 32, wherein the phase correction circuit further comprises a digital to analog converter coupled to the fixed up/down counter being adapted for converting the steering signal into a steering current.

34. The circuit, as set forth in claim 32, wherein the cycle slip circuit comprises a cycle slip counter for counting a predetermined number of consecutive up cycle slip signals or a predetermined number of consecutive down cycle slip signals being received.

35. The circuit, as set forth in claim 31, wherein the phase correction circuit comprises a state machine.

36. The circuit, as set forth in claim 31, wherein the up cycle slip detector comprises:
  a latch adapted for latching the up pulse width modulated cycle slip signal with the input signal; and
  a logic circuit adapted for receiving the latched up pulse width modulated cycle slip signal and generating an up cycle slip signal indicative that the oscillator output signal is lagging behind the input signal.

37. The circuit, as set forth in claim 31, wherein the down cycle slip detector comprises:
  a latch adapted for latching the down pulse width modulated cycle slip signal with the oscillator output signal; and
  a logic circuit adapted for receiving the latched down pulse width modulated cycle slip signal and generating a down cycle slip signal indicative that the oscillator output signal is ahead of the input signal.

* * * * *